(12) United States Patent
Lee et al.

(10) Patent No.: US 8,906,582 B2
(45) Date of Patent: Dec. 9, 2014

(54) BLANK MASKS FOR EXTREME ULTRA VIOLET LITHOGRAPHY, METHODS OF FABRICATING THE SAME, AND METHODS OF CORRECTING REGISTRATION ERRORS THEREOF

(71) Applicant: SK Hynix Inc., Icheon-si Gyeonggi-do (KR)

(72) Inventors: Young Mo Lee, Cheongju-si (KR); Byung Ho Nam, Daegu (KR)

(73) Assignee: SK Hynix Inc., Gyeonggi-do (KR)

( * ) Notice: Subject to any disclaimer, the term of this patent is extended or adjusted under 35 U.S.C. 154(b) by 56 days.

(21) Appl. No.: 13/718,947

(22) Filed: Dec. 18, 2012

(65) Prior Publication Data
US 2014/0030639 A1 Jan. 30, 2014

(30) Foreign Application Priority Data

Jul. 30, 2012 (KR) .................. 10-2012-0083536

(51) Int. Cl.
*G03F 1/22* (2012.01)
*G03F 1/24* (2012.01)
*G03F 1/76* (2012.01)
*G03F 1/80* (2012.01)
*G03F 1/72* (2012.01)

(52) U.S. Cl.
CPC .. *G03F 1/22* (2013.01); *G03F 1/76* (2013.01); *G03F 1/80* (2013.01); *G03F 1/72* (2013.01)

USPC ............................................ 430/5

(58) Field of Classification Search
USPC .................. 430/5, 322, 323, 394; 378/35
See application file for complete search history.

(56) References Cited

U.S. PATENT DOCUMENTS

| | | | |
|---|---|---|---|
| 7,736,821 B2 | 6/2010 | Hayashi et al. | |
| 7,947,415 B2 | 5/2011 | Amano et al. | |
| 7,960,077 B2 | 6/2011 | Ikuta et al. | |
| 2010/0167182 A1* | 7/2010 | Oh et al. ............... | 430/5 |
| 2012/0127444 A1* | 5/2012 | Huh et al. ............. | 355/66 |

FOREIGN PATENT DOCUMENTS

| | | |
|---|---|---|
| KR | 1020040090413 A | 10/2004 |
| KR | 1020060050241 A | 5/2006 |
| KR | 1020090097790 A | 9/2009 |
| KR | 1020100030151 A | 3/2010 |

* cited by examiner

*Primary Examiner* — Stephen Rosasco
(74) *Attorney, Agent, or Firm* — William Park & Associates Patent Ltd.

(57) ABSTRACT

Blank masks for extreme ultraviolet (EUV) photolithography are provided. The blank mask includes a substrate having a first surface and a second surface which are opposite to each other, a reflection layer disposed on the first surface of the substrate to reflect extreme ultraviolet (EUV) rays, an absorption layer disposed on the reflection layer opposite to the substrate to absorb extreme ultraviolet (EUV) rays, and a conductive layer disposed on the second surface of the substrate to expose portions of the substrate. Related methods are also provided.

5 Claims, 6 Drawing Sheets

BLANK MASKS FOR EXTREME ULTRA VIOLET LITHOGRAPHY, METHODS OF FABRICATING THE SAME, AND METHODS OF CORRECTING REGISTRATION ERRORS THEREOF

CROSS-REFERENCES TO RELATED APPLICATIONS

The present application claims priority under 35 U.S.C 119(a) to Korean Application No. 10-2012-0083536, filed on Jul. 30, 2012, in the Korean intellectual property Office, which is incorporated herein by reference in its entirety as set forth in full.

BACKGROUND

Embodiments of the present disclosure generally relate to photo masks used in fabrication of semiconductor devices and, more particularly, to blank masks for extreme ultraviolet (EUV) lithography, methods of fabricating the same, and methods of correcting registration errors thereof.

Semiconductor devices are manufactured using various unit processes such as a deposition process, a lithography process, an etching process, a diffusion process, an impurity implantation process and/or the like. The lithography process may be performed with a photo mask including circuit patterns, and the shapes of the circuit patterns may be transferred onto a wafer during the lithography process. As the semiconductor devices become more highly integrated, sizes of the circuit patterns of the photo mask have been continuously reduced. Thus, there may be some limitations in fabricating the photo masks. In particular, as the semiconductor devices are scaled down to have a minimum feature size of about 30 nanometers or less, there may be still limitations in transferring the fine patterns having line widths of about 30 nanometers or less on a wafer with a lithography apparatus that employs argon fluoride (ArF) lasers generating deep ultraviolet (DUV) rays as light sources. Thus, extreme ultraviolet (EUV) lithography processes have been proposed to overcome the limitations of the lithography process utilizing the deep ultraviolet (DUV) rays.

The EUV lithography processes may use EUV rays having a wave length within the range of about 13.2 nanometers to about 13.8 nanometers, which is shorter than wavelengths of lights generated by KrF lasers or ArF lasers. The EUV rays may be more readily absorbed into most of material layers and may have a refractive index of about one in most of material layers. Thus, it may be difficult to apply refracting optical systems used in the conventional lithography processes with visible rays or general ultraviolet rays to the EUV lithography processes. For the reasons described above, the EUV lithography processes employ reflecting optical systems (also referred to as mirror optical systems), for example, reflection type photo masks and mirrors.

The reflection type photo masks used in the EUV lithography processes may be configured to include a mask substrate and a light reflection layer on the mask substrate. The light reflection layer may include a plurality of molybdenum (Mo) layers and a plurality of silicon (Si) layers which are alternately stacked. That is, the light reflection layer may be a laminated layer. Meanwhile, circuit patterns of the reflection type photo masks may be formed of a light absorption layer, and shapes of the circuit patterns may be transferred onto a wafer. The light absorption layer and the light reflection layer may be formed using an ion beam sputtering technique or a magnetron sputtering technique.

When the light absorption layer and the light reflection layer are formed on the mask substrate, the mask substrate is supported by a supporting member, for example, a mechanical chuck or an electrostatic chuck. The mechanical chuck may cause vibration of the mask substrate during the process for forming the light absorption layer or the light reflection layer. Thus, the electrostatic chuck rather than the mechanical chuck may be widely used as the supporting member. The electrostatic chuck may be used to support the photo mask even when the circuit patterns of the photo mask are formed or the photo mask is handled during the lithography process. Thus, a conductive layer may be formed on a surface of the reflection type photo mask opposite to the circuit patterns and alignment marks to fix the reflection type photo mask on the electrostatic chuck employed in an EUV lithography apparatus. In general, the conductive layer on the reflection type photo mask may include an opaque material blocking lights, for example, a chrome nitride layer, and an entire back side surface of the mask substrate may be cover with the conductive layer.

Recently, high overlay accuracy of the photo masks has been increasingly demanded with reduction of design rules of the semiconductor devices, and improvement of mask registration errors has been continuously required. In the event that an ArF light source is used in a lithography process, the mask registration errors may be corrected by irradiating a laser onto a back side surface of a photo mask to deform a mask substrate (e.g., a quartz substrate). However, in case of the EUV lithography process, it may be difficult to correct the mask registration errors with a method of irradiating a laser onto a back side surface of the reflection type photo mask because the back side surface of the reflection type photo mask is covered with a conductive layer.

SUMMARY

Various embodiments are directed to blank masks for extreme ultraviolet (EUV) lithography, methods of fabricating the same, and methods of correcting registration errors thereof.

According to various embodiments, a blank mask for extreme ultraviolet (EUV) lithography includes a substrate having a first surface and a second surface which are opposite to each other, a reflection layer disposed on the first surface of the substrate to reflect extreme ultraviolet (EUV) rays, an absorption layer disposed on the reflection layer opposite to the substrate to absorb extreme ultraviolet (EUV) rays, and a conductive layer disposed on the second surface of the substrate to expose portions of the substrate.

In various embodiments, the conductive layer may uniformly expose the portions of the second surface throughout the second surface.

In various embodiments, the conductive layer may include a chrome nitride (CrN) layer.

In various embodiments, the substrate may have a plurality of trenches having a predetermined depth from the second surface, and the conductive layer may be disposed in the trenches.

In various embodiments, the conductive layer may have a substantially checkerboard shape or a mesh shape in a plan view, and the blank mask may further comprise an insulation layer on the exposed portions of the second surface.

In various embodiments, the insulation layer may include a material layer that transmits lights or rays.

In various embodiments, the blank mask may further comprise at least one of a capping layer and a buffer layer between the reflection layer and the absorption layer.

According to various embodiments, a method of fabricating a blank mask for extreme ultraviolet (EUV) lithography includes forming a resist pattern on a back side surface of a transparent substrate to expose portions of the back side surface, applying an etching process to the exposed portions of the back side surface to form trenches, removing the resist pattern after formation of the trenches, forming a conductive layer in the trenches after removal of the resist pattern, and sequentially forming a laminated reflection layer, a capping layer and an absorption layer on a front side surface of the substrate opposite to the conductive layer.

In various embodiments, the trenches may be formed to have a depth of about 70 nanometers to about 300 nanometers.

In various embodiments, the trenches may be uniformly arrayed throughout an entire region of the back side surface to have a substantially checkerboard shape or a mesh shape in a plan view.

In various embodiments, forming the conductive layer in the trenches may include depositing a conductive material on the back side surface of the substrate to fill the trenches and planarizing the conductive material to expose the back side surface of the substrate.

In various embodiments, the conductive material may be planarized using an etch back process or a chemical mechanical polishing (CMP) process.

In various embodiments, the conductive layer may be formed of a chrome nitride (CrN) layer.

According to various embodiments, a method of fabricating a blank mask for extreme ultraviolet (EUV) lithography includes forming an insulation layer on a back side surface of a transparent substrate, patterning the insulation layer to expose portions of the substrate, forming a conductive layer on the exposed portions of the substrate, and sequentially forming a laminated reflection layer and an absorption layer on a front side surface of the substrate opposite to the conductive layer.

In various embodiments, the insulation layer may be formed to have a thickness of about 70 nanometers to about 300 nanometers.

In various embodiments, forming the conductive layer may include depositing a conductive material that covers the patterned insulation layer and the exposed portions of the substrate and planarizing the conductive material to expose the patterned insulation layer.

In various embodiments, the conductive material may be planarized using an etch back process or a chemical mechanical polishing (CMP) process.

In various embodiments, the conductive layer may be formed of a chrome nitride (CrN) layer.

According to various embodiments, a method of fabricating a blank mask for extreme ultraviolet (EUV) lithography includes forming a conductive layer on a back side surface of a transparent substrate, patterning the conductive layer to expose portions of the substrate, forming an insulation layer on the exposed portions of the substrate, and sequentially forming a laminated reflection layer and an absorption layer on a front side surface of the substrate opposite to the patterned conductive layer.

In various embodiments, the conductive layer may be formed to have a thickness of about 70 nanometers to about 300 nanometers.

In various embodiments, forming the insulation layer may include depositing an insulation material that covers the patterned conductive layer and the exposed portions of the substrate, and planarizing the conductive material to expose the patterned insulation layer.

In various embodiments, the insulation material may be planarized using an etch back process or a chemical mechanical polishing (CMP) process.

In various embodiments, the insulation layer may be formed of a transparent insulation layer and the conductive layer is formed of a chrome nitride (CrN) layer.

According to various embodiments, a method of correcting a registration error of a photo mask for extreme ultraviolet (EUV) lithography includes providing a laser irradiation apparatus and a mask for extreme ultraviolet (EUV) photolithography, irradiating laser beams onto the mask using the laser irradiation apparatus, measuring permeability of the laser beams through an entire region of the mask to extract mask registration errors, and compensating the mask registration errors according to the measured permeability.

In various embodiments, the mask may be fabricated to include a substrate having a first surface and a second surface which are opposite to each other, a reflection layer disposed on the first surface of the substrate to reflect extreme ultraviolet (EUV) rays, an absorption layer disposed on the reflection layer opposite to the substrate to absorb extreme ultraviolet (EUV) rays, and a conductive layer disposed on the second surface of the substrate to expose portions of the substrate.

BRIEF DESCRIPTION OF THE DRAWINGS

The above and other features and advantages of the disclosure will become more apparent in view of the attached drawings and accompanying detailed description, in which.

DESCRIPTION OF SPECIFIC EMBODIMENTS

Figure 1:
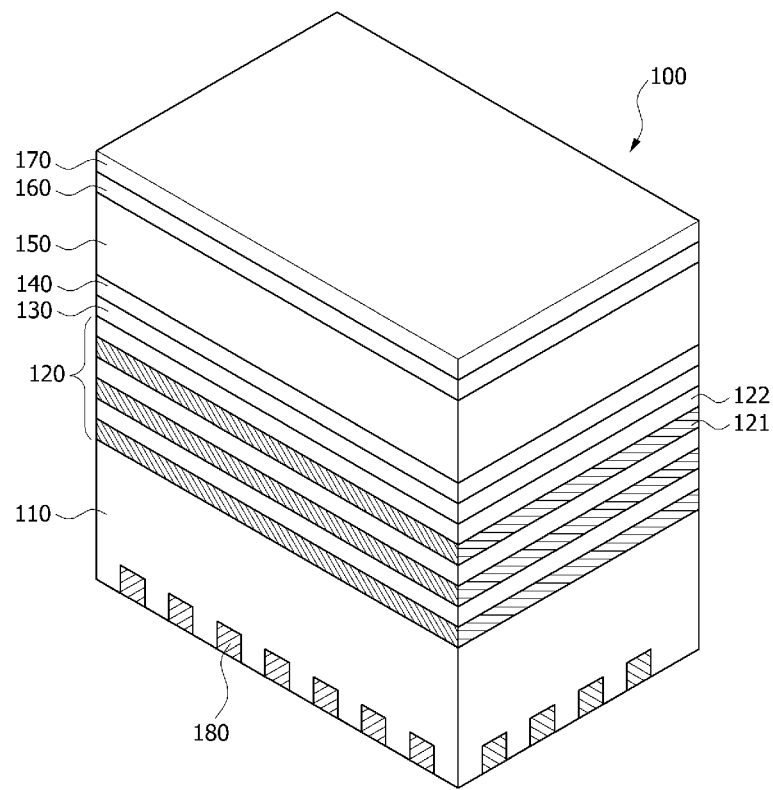
FIG. 1 is a perspective view illustrating a blank mask for extreme ultraviolet (EUV) lithography according to an embodiment.

Various embodiments will now be described more fully with reference to the accompanying drawings, in which various embodiments are shown. Various embodiments may, however, be embodied in many different forms and should not be construed as being limited to the embodiments set forth herein. Rather, these embodiments are provided so that this disclosure will be thorough and complete, and will fully convey the concept of various embodiments to those of ordinary skill in the art. In the drawings, the thicknesses of layers and regions are exaggerated for clarity. Like reference designators in the drawings denote like or corresponding elements, and thus their description will be omitted to avoid duplicate explanation.

Figure 2:
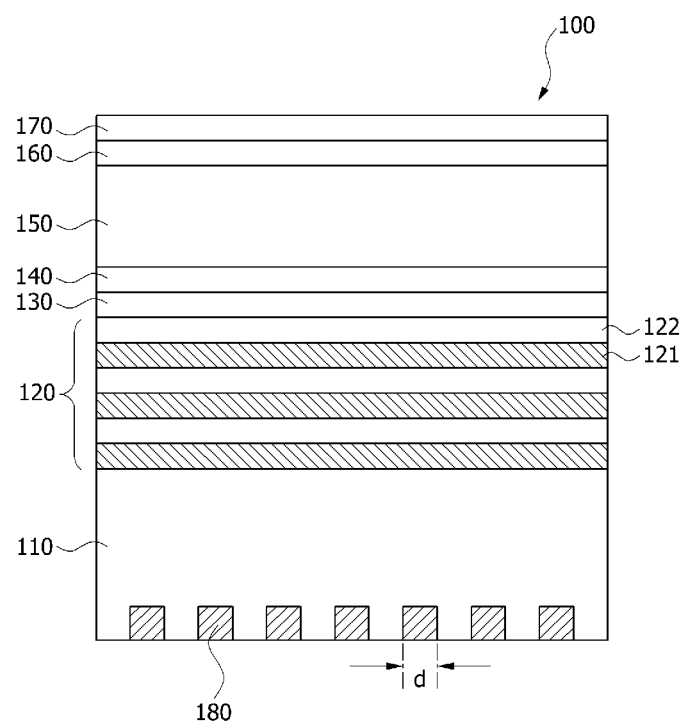
FIG. 2 is a cross sectional view illustrating a blank mask for extreme ultraviolet (EUV) lithography according to an embodiment.
Figure 3:
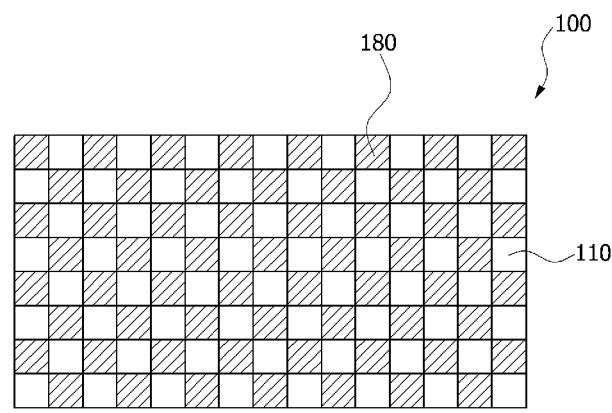
FIG. 3 is a plan view illustrating a back side surface of a blank mask for extreme ultraviolet (EUV) lithography according to an embodiment.

FIG. 1 is a perspective view illustrating a blank mask for extreme ultraviolet (EUV) lithography according to an embodiment, FIG. 2 is a cross sectional view illustrating a blank mask for extreme ultraviolet (EUV) lithography according to an embodiment, and FIG. 3 is a plan view illustrating a back side surface of a blank mask for extreme ultraviolet (EUV) lithography according to an embodiment.

Referring to FIGS. 1, 2, and 3, a blank mask 100 for extreme ultraviolet (EUV) lithography according to an embodiment may include a mask substrate 110 such as a transparent substrate, a laminated reflection layer 120 disposed on a front side surface of the mask substrate 110 to reflect EUV rays, a capping layer 130 (or a buffer layer 140), and an absorption layer 150 sequentially stacked on a top surface of the laminated reflection layer 120 opposite to the mask substrate 110, and a conductive layer 180 disposed on a back side surface of the mask substrate 110 opposite to the laminated reflection layer 120.

The mask substrate 110 may include a material layer having a low thermal expansion coefficient (LTE). For example, the mask substrate 110 may be a glass substrate or a quartz substrate.

The laminated reflection layer 120 may be formed by alternately stacking a plurality of first material layers 121 and a plurality of second material layers 122 having different optical characteristics from each other. Thus, the laminated reflection layer 120 may correspond to a Bragg reflector that exhibits a Bragg reflection phenomenon occurring at interfaces between the first material layers 121 and the second material layers 122. For example, the first material layers 121 may be a plurality of high refractive material layers, and the second material layers 122 may be low refractive material layers.

In various embodiments, the laminated reflection layer 120 may include a plurality of molybdenum (Mo) layers having a relatively high refractive index and a plurality of silicon (Si) layers having a relatively low refractive index which are alternately stacked. That is, the laminated reflection layer 120 may include the plurality of molybdenum (Mo) layers and the plurality of silicon (Si) layers disposed between the plurality of molybdenum (Mo) layers. Alternatively, the laminated reflection layer 120 may be formed by repeatedly stacking any one selected from the group consisting of a bi-layer of a molybdenum (Mo) layer and a beryllium (Be) layer, a bi-layer of a ruthenium (Ru) layer and a silicon (Si) layer, a bi-layer of a silicon (Si) layer and a niobium (Nb) layer, a bi-layer of a molybdenum carbide (MoC) layer and a silicon (Si) layer, a bi-layer of a molybdenum compound layer and a silicon compound layer, and a triple-layer of a molybdenum (Mo) layer, a molybdenum carbide (MoC) layer and a silicon (Si) layer. The stack number of the bi-layer or the triple-layer constituting the laminated reflection layer 120 may be equal to or greater than '30' to obtain a reflectivity of about 50% or greater. Alternatively, the stack number of the bi-layer or the triple-layer constituting the laminated reflection layer 120 may be equal to or greater than '35' to obtain a reflectivity of about 60% or higher. In various embodiments, the stack number of the bi-layer or the triple-layer constituting the laminated reflection layer 120 may be within the range of about 40 to about 60 to obtain a reflectivity of about 60% or greater. Further, the laminated reflection layer 120 may have a total thickness of about 210 nanometers to about 300 nanometers, but not limited thereto. For example, the total thickness of the laminated reflection layer 120 may be determined in consideration of a wavelength of the EUV rays used in the EUV lithography process.

The capping layer 130 stacked on the laminated reflection layer 120 may protect the laminated reflection layer 120. In various embodiments, the capping layer 130 may include a silicon oxide ($SiO_2$) layer or a silicon (Si) layer. The capping layer 130 may suppress oxidation or contamination of the laminated reflection layer 120 and may prevent the laminated reflection layer 120 from being damaged when the absorption layer 150 on the capping layer 130 is patterned.

The buffer layer 140 and the absorption layer 150 may be sequentially stacked on the capping layer 130. In various embodiments, the buffer layer 140 may include a silicon oxide ($SiO_2$) layer, and the absorption layer 150 may include one of material layers which are capable of absorbing the EUV rays. For example, the absorption layer 150 may include a conductive absorption layer such as a tantalum containing layer, for example, a tantalum nitride (TaN) layer. The tantalum containing layer may be more readily etched by a plasma etching process utilizing fluorine type radicals which are widely used in fabrication of semiconductor devices. Thus, the absorption layer 150 may be formed of the tantalum containing layer. However, the tantalum containing layer is merely an example of suitable materials for the absorption layer 150. That is, the absorption layer 150 may be formed of any material having an appropriate absorptivity to the EUV rays.

The capping layer 130 and the buffer layer 140 may be optional elements. For example, at least one of the capping layer 130 and the buffer layer 140 may be disposed between the laminated reflection layer 120 and the absorption layer 150.

An anti-reflective layer 160 and a resist layer 170 may be additionally and sequentially stacked on a top surface of the absorption layer 150 opposite to the laminated reflection layer 120.

The conductive layer 180 may be disposed on the back side surface of the mask substrate 110 opposite to the laminated reflection layer 120, as described above. The conductive layer 180 may be, for example, a chrome nitride (CrN) layer. When the blank mask 100 is loaded into an EUV lithography apparatus or other apparatuses, the conductive layer 180 may act as an electrical adhesion layer for attaching the blank mask 100 to an electrostatic chuck of the EUV lithography apparatus or the other apparatuses. Further, the conductive layer 180 may be partially disposed on the back side surface of the mask substrate 110 to expose portions of the mask substrate 110. This is for allowing lights or rays to penetrate the mask substrate 110 through the exposed portions of the mask substrate 110 during a process for correcting a registration of the blank mask 100. Measurement and correction of the mask registration error may be performed throughout the blank mask 100. Thus, the conductive layer 180 may be disposed on the back side surface of the mask substrate 110 such that the exposed portions of the mask substrate 110 may be uniformly and regularly arrayed throughout the back side surface of the mask substrate 110.

In various embodiments, the conductive layer 180 may be disposed to fill trenches which are formed by etching the mask substrate 110 to a certain depth, as illustrated in FIGS. 1 and 2. In addition, the conductive layer 180 may be disposed to have substantially a checkerboard shape including a plurality of segments when viewed from a plan view, but not limited thereto. The size of each of the segments (i.e., d) constituting the substantially checkerboard shape and spaces therebetween may be adjusted such that lights or rays used in correction of the mask registration error appropriately penetrate the mask substrate 110.

As described above, because the conductive layer 180 for attaching the mask substrate 110 to an electrostatic chuck may be disposed to substantially have a checkerboard shape partially and uniformly exposing portions of the mask substrate 110, lights or rays may be irradiated onto the back side surface of the mask substrate 110 to successfully perform a process of correcting the mask registration error. As a result, reliable EUV photo masks may be fabricated by successfully carrying out the process of correcting the mask registration error.

Figure 4:
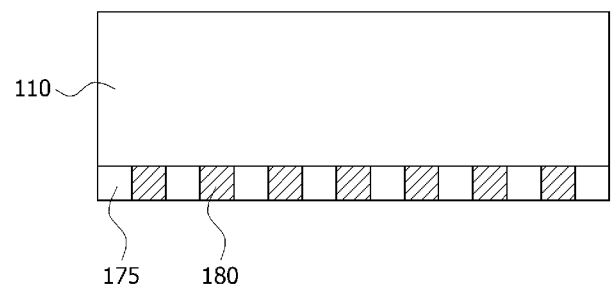
FIG. 4 is a cross sectional view illustrating a blank mask for extreme ultraviolet (EUV) lithography according to an embodiment.

FIG. 4 is a cross sectional view illustrating a blank mask for extreme ultraviolet (EUV) lithography according to an embodiment. To avoid duplicate explanation, descriptions to the same elements as set forth in the previous embodiments illustrated in FIG. 2 may be omitted or briefly mentioned in these embodiments.

Referring FIG. 4, an insulation layer 175 may be disposed on a back side surface of a mask substrate 110 to have holes exposing portions of the back side surface of a mask substrate 110. The holes of the insulation layer 175 may be filled with a conductive layer 180. The conductive layer 180 may include a chrome nitride (CrN) layer and may have a substantially checkerboard shape in a plan view. However, the shape of the conductive layer 180 may not be limited to the checkerboard shape. For example, the conductive layer 180 may have any other shape (e.g., a mesh shape or the like) that allows lights or rays used in correction of mask registration errors to uniformly penetrate the mask substrate 110.

In an embodiment, the insulation layer 175 may be a material layer that transmits lights or rays used in correction of mask registration errors. According to the previous embodiment illustrated in FIGS. 1 to 3, the conductive layer 180 may be formed by etching portions of the mask substrate 110 to form trenches having a certain depth and by filling the trenches with a conductive material. Additionally, according to an embodiment, the conductive layer 180 may be formed by depositing a transparent insulation layer 175 on the back side surface of the mask substrate 110, by patterning the transparent insulation layer 175 to form holes therein, and by filling the holes with a conductive material without etching the mask substrate 110. That is, the transparent insulation layer 175 may act as a portion of the mask substrate 110.

According to an embodiment, the conductive layer 180 may be formed to allow the lights or rays used in correction of mask registration errors to uniformly penetrate the mask substrate 110 without use of an etching process for forming trenches in the mask substrate 110. Thus, etch damage applied to the mask substrate 110 and/or contamination of the mask substrate 110 can be minimized or suppressed. Further, the mask substrate 110 may be attached and fixed to an electrostatic chuck because of the presence of the conductive layer 180 during a process for correcting the mask registration errors. This may lead to fabrication of high reliable photo masks.

In various embodiments, formation of the conductive layer 180 may be followed by formation of the transparent insulation layer 175. That is, the conductive layer 180 may be formed on the back side surface of the mask substrate 110 and may be patterned to form holes exposing portions of the back side surface of the mask substrate 110, and the holes of the conductive layer 180 may be filled with the transparent insulation layer 175.

In various embodiments, the conductive layer 180 may include a transparent conductive layer, for example, an indium tin oxide (ITO) layer. In such a case, since the transparent conductive layer 180 may allow penetration of lights or rays and use of an electrostatic chuck, the insulation layer 175 may include an opaque material layer that does not transmit lights or rays.

Figure 5:
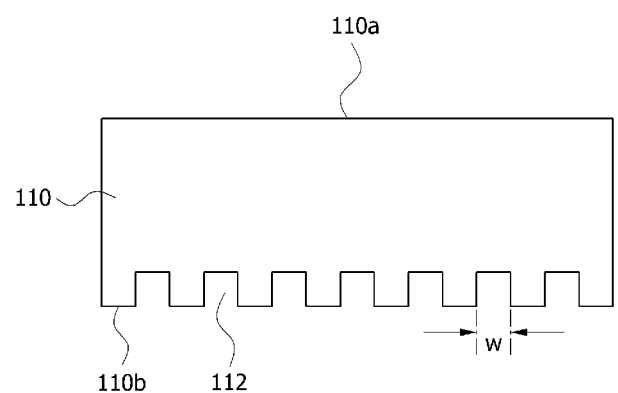
FIGS. 5, 6 and 7 are cross sectional views illustrating a method of fabricating a blank mask for extreme ultraviolet (EUV) lithography according to an embodiment.
Figure 6:
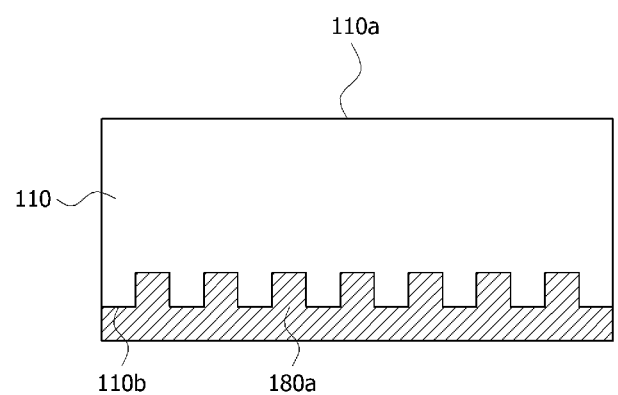
Figure 7:
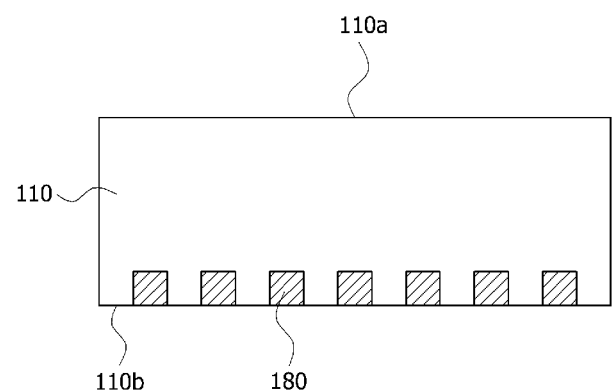

FIGS. 5, 6, and 7 are cross sectional views illustrating a method of fabricating a blank mask for extreme ultraviolet (EUV) lithography according to an embodiment.

Referring to FIG. 5, a mask substrate 110, for example, a transparent mask substrate may be provided. The mask substrate 110 may include a front side surface 110a (i.e., first surface) and a back side surface 110b (i.e., second surface) facing each other. The mask substrate 110 may be formed of a material having a low thermal expansion coefficient (LTE). For example, the mask substrate 110 may be a glass substrate or a quartz substrate.

A plurality of trenches 112 maybe formed in the mask substrate 110 adjacent to the back side surface 110b thereof. Specifically, a resist layer may be coated on the back side surface 110b of the mask substrate 110. The resist layer may then be patterned using an exposure process with electron beams or lasers and using a development process to expose portions of the back side surface 110b of the mask substrate 110. Subsequently, an etching process may be applied to the exposed portions of the back side surface 110b of the mask substrate 110, thereby forming the trenches 112 having a depth of about 70 nanometers to about 300 nanometers. The etching process for forming the trenches 112 may be performed using a dry etching technique that employs a mixture of a carbon tetra fluoride ($CF_4$) gas, an oxygen ($O_2$) gas and a helium (He) gas as an etching gas. Each of the trenches 112 may be formed to have a width W of about 10 micrometers to about 50 micrometers, and the trenches 112 may be arrayed substantially along an X-axis and a Y-axis to form a matrix shape when viewed from a plan view.

Referring to FIG. 6, the patterned resist layer may be removed and a cleaning process may be applied to the mask substrate 110 where the patterned resist layer is removed. A conductive layer 180a may then be formed to fill the trenches 112 on the back side surface 110b of the mask substrate 110. The conductive layer 180a may be formed of a chrome nitride (CrN) layer using a general deposition process. The conductive layer 180a may be formed to a sufficient thickness to fill the trenches 112.

Referring to FIG. 7, the conductive layer 180a may be planarized using an etch back process or a chemical mechanical polishing (CMP) process to form conductive layer 180 only in the trenches 112. Subsequently, although not shown in the drawings, a laminated reflection layer, a capping layer and/or a buffer layer, an absorption layer and an anti-reflective layer may be deposited on the front side surface 110a of the mask substrate 110 using general processes, thereby forming a bank mask for extreme ultraviolet (EUV) lithography illustrated in FIG. 1.

Figure 8:
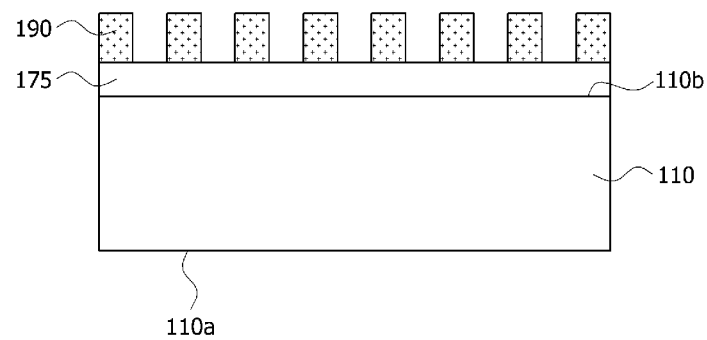
FIGS. 8 and 9 are cross sectional views illustrating a method of fabricating a blank mask for extreme ultraviolet (EUV) lithography according to an embodiment.
Figure 9:
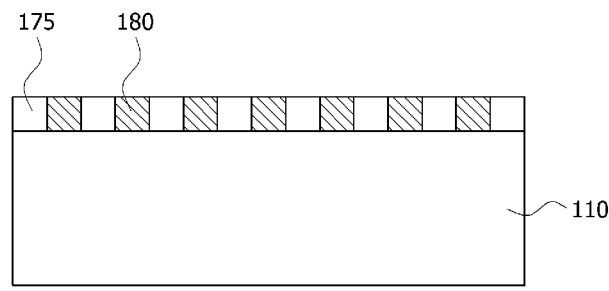

FIGS. 8 and 9 are cross sectional views illustrating a method of fabricating a blank mask for extreme ultraviolet (EUV) lithography according to another embodiment.

Referring to FIG. 8, a mask substrate 110, for example, a transparent mask substrate may be provided. The mask substrate 110 may include a front side surface 110a and a back side surface 110b facing each other. The mask substrate 110 may be formed of a material having a low thermal expansion coefficient (LTE). For example, the mask substrate 110 may be a glass substrate or a quartz substrate.

An insulation layer 175 may be formed on the back side surface 110b of the mask substrate 110. The insulation layer 175 may be formed of a transparent material layer that transmits lights or rays used in correction of mask registration errors. A thickness of the insulation layer 175 may correspond to a thickness of a conductive layer which is formed in a subsequent process. That is, the insulation layer 175 may be formed to have a thickness which is substantially equal to the depth of the trenches 112 described in the previous embodiments. For example, the insulation layer 175 may be formed to a thickness of about 70 nanometers to about 300 nanometers.

A mask layer 190 may then be formed on a side of the insulation layer 175 opposite to the mask substrate 110. The mask layer 190 may be formed by coating a resist layer on the insulation layer 175, selectively exposing portions of the resist layer to electron beams or lasers, and developing the exposed resist layer to expose portions of insulation layer 175.

Referring to FIG. 9, the insulation layer 175 may be etched using the mask layer 190 as an etch mask to expose portions of the mask substrate 110. The mask layer 190, for example, the resist pattern may then be removed. The etched insulation layer 175 may be formed such that the exposed portions of the mask substrate 110 have a substantially checkerboard shape, a mesh shape, or the like when viewed from a plan view. Subsequently, a conductive material may be deposited on the etched insulation layer 175 and on the exposed mask substrate 110. The conductive material may be a chrome nitride (CrN) layer. The conductive material may be planarized using an etch back process or a chemical mechanical polishing (CMP) process to form a conductive layer 180 remained only on the exposed mask substrate 110. As a result, the conductive layer 180 may be formed to have a checkerboard shape, a mesh shape or the like when viewed from a plan view.

The following processes may be performed using the same manners as described in the previous embodiments. Although an embodiment is described in conjunction with an example that the conductive layer 180 is deposited after formation of the insulation layer 175, the inventive concept is not limited thereto. For example, a conductive layer may be deposited on the back side surface 110b of the mask substrate 110 and patterned to expose portions of the mask substrate 110, and an insulation layer may be deposited on the patterned conductive layer and planarized to expose a top surface of the patterned conductive layer.

Now, a method of correcting mask registration errors is described hereinafter.

Figure 10:
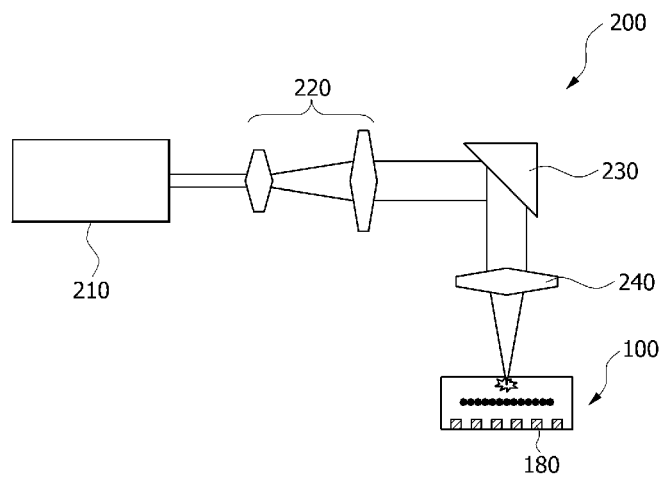
FIG. 10 is a schematic view illustrating a method of correcting registration errors of photo masks for extreme ultraviolet (EUV) lithography according to various embodiments.

FIG. 10 is a schematic view illustrating a method of correcting registration errors of photo masks for extreme ultraviolet (EUV) lithography according to various embodiments.

Referring to FIG. 10, a laser irradiation apparatus 200 and a sample mask 100 for extreme ultraviolet (EUV) lithography may be provided. The laser irradiation apparatus 200 may be an apparatus which is used in a process of correcting registration errors of a general photo mask. In various embodiments, the laser irradiation apparatus 200 may include a laser generator 210 for generating pulsed laser beams, an expander 220 for enlarging an area on which the pulsed laser beams from the laser generator 210 are irradiated, a refractor 230 for guiding the enlarged laser beams toward the sample mask 100, and a concentrator 240 for concentrating the refracted laser beams.

The sample mask 100 for extreme ultraviolet (EUV) lithography may include a mask substrate and a conductive layer 180 partially disposed on a back side surface of the mask substrate, as illustrated in FIGS. 1 to 4. That is, the conductive layer 180 may have a substantially checkerboard shape, a mesh shape, or the like in a plan view. The conductive layer 180 may be disposed to attach and fix the sample mask 100 onto an electrostatic chuck and to expose portions of the back side surface of the mask substrate. Thus, sample mask 100 may partially transmit the laser beams through the exposed portions thereof. Accordingly, registration data of the sample EUV mask 100 may be obtained using the laser irradiation apparatus 200, and any registration errors may be corrected using the registration data of the sample EUV mask 100.

The laser beams concentrated by the concentrator 240 may be focused on a central region of the sample EUV mask 100, and the focused laser beams may be scanned and irradiated onto the entire region of the sample EUV mask 100 with a constant beam density to obtain a uniform permeability of the sample EUV mask 100. Portions on which the focused laser beams are irradiated may be deformed by the energy of the focused laser beams.

After the focused laser beams are irradiated onto the entire region of the sample EUV mask 100, the permeability may be measured throughout the sample EUV mask 100 to find out mask registration errors. If the permeability of the sample EUV mask 100 is non-uniform, it may be understood that the sample EUV mask 100 has a registration error. In such a case, the laser beams may be controlled to have a higher intensity or a lower intensity, and the controlled laser beams may be irradiated onto the portions of the sample EUV mask 100 exhibiting a relatively low permeability or a relatively high permeability to compensate the low or high permeability.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A blank mask for extreme ultraviolet (EUV) photolithography, the blank mask comprising:
   a substrate having a first surface and a second surface which are opposite to each other, the substrate having a plurality of trenches having a predetermined depth from the second surface;
   a reflection layer disposed on the first surface of the substrate to reflect extreme ultraviolet (EUV) rays;
   an absorption layer disposed on the reflection layer opposite to the substrate to absorb extreme ultraviolet (EUV) rays; and
   a conductive layer disposed in the trenches, wherein a surface of the conductive layer is coplanar with the second surface of the substrate.

2. The blank mask of claim 1, wherein the trenches are uniformly distributed throughout the second surface.

3. The blank mask of claim 1, wherein the conductive layer has a substantially checkerboard shape or a mesh shape.

4. The blank mask for extreme ultraviolet (EUV) photolithography, the blank mask comprising:
   a substrate having a first surface and a second surface which are opposite to each other;
   a reflection layer disposed on the first surface of the substrate to reflect extreme ultraviolet (EUV) rays;
   an absorption layer disposed on the reflection layer opposite to the substrate to absorb extreme ultraviolet (EUV) rays;
   an insulation layer on the second surface of the substrate, the insulation layer having a plurality of trenches to expose portions of the substrate; and
   a conductive layer disposed in the trenches, wherein a surface of the conductive layer is coplanar with the surface of the insulation layer.

5. The blank mask of claim 4, wherein the conductive layer has a substantially checkerboard shape or a mesh shape.

* * * * *